United States Patent
Chen

Patent Number: 6,034,441
Date of Patent: Mar. 7, 2000

[54] OVERCAST SEMICONDUCTOR PACKAGE

[75] Inventor: Shiaw-Jong Steve Chen, Plano, Tex.

[73] Assignee: Lucent Technologies, Inc., Murray Hill, N.J.

[21] Appl. No.: 08/979,063

[22] Filed: Nov. 26, 1997

[51] Int. Cl.[7] .......................... H01L 23/28; H01L 23/48; H01L 23/04
[52] U.S. Cl. .................. 257/787; 257/693; 257/697; 257/698
[58] Field of Search ................. 257/787, 693, 257/697, 698

[56] References Cited

U.S. PATENT DOCUMENTS

| | | | |
|---|---|---|---|
| 4,954,307 | 9/1990 | Yokoyama | 264/272.15 |
| 5,012,386 | 4/1991 | McShane et al. | 361/386 |
| 5,049,055 | 9/1991 | Yokoyama | 425/116 |
| 5,095,359 | 3/1992 | Tanaka et al. | 357/74 |
| 5,133,921 | 7/1992 | Yokoyama | 264/272.15 |
| 5,173,766 | 12/1992 | Long et al. | 257/687 |
| 5,239,198 | 8/1993 | Lin et al. | 257/693 |
| 5,247,423 | 9/1993 | Lin et al. | 361/719 |
| 5,468,995 | 11/1995 | Higgins, III | 257/697 |
| 5,492,586 | 2/1996 | Gorczyca | 156/245 |
| 5,598,036 | 1/1997 | Ho | 257/738 |

FOREIGN PATENT DOCUMENTS

| | | |
|---|---|---|
| 59-227131 | 6/1983 | Japan . |
| 1-32660 | 2/1989 | Japan ...................................... 257/697 |
| 4-186660 | 7/1992 | Japan ...................................... 257/697 |

*Primary Examiner*—Mahshid Saadat
*Assistant Examiner*—Jhihan B. Clark
*Attorney, Agent, or Firm*—Locke Liddell & Sapp LLP

[57] ABSTRACT

The present invention relates to semiconductor devices packaged using overcasting. The overcast devices of the present invention incorporate encapsulative materials, such as ultraviolet-curing material, which are cast in open stencils at approximately ambient pressure (and potentially at approximately ambient temperature) over electronic components mechanically and electrically connected to the substrate. The overcast semiconductor devices of the present invention may incorporate new encapsulative materials, including UV-cured materials and longer shelf life materials, poorly suited for the pressures and temperatures of injection molding. The overcast devices also allow the incorporation of substrate materials which are not feasible for use with a higher pressure, higher temperature forming process. At the same time, the overcast devices of the present invention maintain the low profiles associated with overmolding rather than the larger/taller profile packages generated by shell and gel and preformed package methods.

22 Claims, 8 Drawing Sheets

OVERCAST SEMICONDUCTOR PACKAGE

FIELD OF THE INVENTION

This invention relates to semiconductor devices in general, and more specifically to overcast packages for semiconductor devices.

BACKGROUND OF THE INVENTION

In general, semiconductor devices require high quality in electrical and mechanical characteristics of dielectric strength, durability, and thermal radiation, however, it is rather difficult to provide an economical manufacturing process of high quality devices in a practical and available form. In a structural view of electronic devices, packaging of a semiconductor element and a support pad therefore is now very important, since the electric and mechanical features in fact depend on the packaged structure of the devices.

Semiconductor devices are widely used in various types of electronic products, consumer products, automobiles, integrated circuit cards, and the like. One feature of semiconductor devices which is important in many of these applications is the small size of a semiconductor device, which includes both the semiconductor die and the package in which it is housed. Keeping device dimensions as small as possible is not only important to single chip devices, but to multiple chip devices as well. However, there is a competing desire for additional I/O's which tends to increase the overall size of the semiconductor device or results in the device having a very fine lead pitch which makes it difficult for the end user to handle.

In addition to establishing a small device size, manufacturers are also driven to maintaining a low cost of manufacturing devices. A significant material cost in manufacturing a semiconductor device other than a semiconductor die is the lead frame. For many devices a customized lead frame must be designed and manufactured for each semiconductor die which is both costly and time consuming.

Resin encapsulated semiconductor devices are usually packaged by either one of two methods. In one method, a semiconductor die, or a plurality of dies, is placed in a package which is then individually mounted on a circuit substrate. In an alternate method, a semiconductor die, or a plurality of dies is mounted directly on the circuit substrate and then is provided with a protective encapsulation structure. The first mentioned method has the advantages that the die is sealed in and protected by the package. The packaged device is easy to test, handle, and install and the encapsulating package provides the desired degree of protection against the environment. In contrast, the second described method in which the die is connected directly to the substrate minimizes the area required by the die and thus allows a very high substrate packing density. In this method, however, an unpackaged die is less easily handled, tested, and burned in, and is more subject to undesirable effects of the environment.

Semiconductor devices may be packaged by several methods commonly used to complete an exposed die which has been directly connected to the substrate. These methods include "overmolding" such as disclosed in U.S. Pat. No. 5,239,198 issued Aug. 24, 1993; "shell and gel" such as disclosed in U.S. Pat. No. 5,095,359 issued Mar. 19, 1992; and the use of premolded plastic packages.

Current overmolded semiconductor packages use epoxy based material formed as a package or device body through transfer or injection molding. Epoxy based molding material has to be kept in the freezer (at approximately −40° C.) and preheated for use. The shelf life is short, a few hours. Unused material has to be discarded. Both early cured molding material as well as material along the runners of the mold must be discarded which accounts for approximately 30–40% of the total molding material. After molding, the package has to be cured for an additional 2 to 3 hours. Transfer or injection molding also requires special equipment at additional cost. To leverage the investment on the equipment and the cost for the special mold, high volume is required (for example greater than 1,000,000 units a year) to justify a new package. Finally transfer or injection molding require the use of fairly substantial heat and pressure in the molding process, which may not always be desirable.

The semiconductor devices produced by other two common approaches also have their disadvantages. For example, the shell and gel approach results in a higher profile (larger dimensions) than that which may be obtained by molding to fit, and may be difficult to fit into the smaller thinner modules which are being demanded by the current market. Premolded plastic packages also have difficulties with size and, perhaps more importantly, again require high volumes to justify the cost of creating new molds and new packages specifically designed for the semiconductor device to be used.

The current systems do not provide an acceptable alternative combining low start-up and change-over costs with the ability to do low volume to high volume packaging while maintaining an acceptable profile for the overall package.

SUMMARY OF THE INVENTION

The present invention relates to a semiconductor device comprising a substrate having a top surface and a bottom surface. The top surface has at least two conductive connecting points in electrical communication with at least two conductive connecting points on the bottom surface. The top surface of the substrate is electrically and mechanically connected to at least one electronic component, typically a semiconductor die. A package body is formed over the electronic component and the conductive connecting points on the top surface of the substrate by casting an electrically insulative encapsulating material at approximately ambient pressure over the component and connecting points. In a preferred embodiment, the "overcasting" is done at ambient temperature also, as well as being done in a manner such that the encapsulative material is directly exposed to radiation from the surrounding environment.

While the overcast semiconductor device may use a standard electrically insulative encapsulating material such as those used in overmolded semiconductor devices, it may also use electrically insulative materials less well-suited for the high pressures and higher temperatures often associated with the normal molding processes. For example, the overcast semiconductor device of the present invention may use an ultraviolet-cured encapsulative material, which is cured by direct exposure to a critical level of ultraviolet light during or after the formation of the package body. The present invention also may incorporate the use of vias directly under the encapsulated material, where higher pressure methods would require extra structural or other efforts to keep material from flowing out of the via during the injection process. Standard flip-chips, wire-bonded chips, and even multi-chip modules are also accommodated by the overcast package. The overcast body may also have a tapered or straight edge. In the present invention, the overcast body is flush or near flush with the side of the substrate of the individual semiconductor package, covering all conductive connections on the top surface of the substrate.

DETAILED DESCRIPTION OF THE INVENTION

The present invention involves semiconductor devices which have been packaged through the use of overcasting. The "overcasting" process involves the casting of encapsulation material in an open stencil or dam system over a previously assembled die and substrate. By casting the encapsulation material over the die and substrate in an open environment ("overcasting") numerous advantages may be obtained in the semiconductor devices which are produced. In particular, the open casting provides forming of the package body at ambient pressure (or approximately ambient pressure, i.e. the atmospheric pressure of the room or environment in which the casting is being performed). Additionally, with some of the preferred encapsulation materials, particularly some of the UV-cured materials, the casting may be done at ambient temperature (or approximately ambient temperature, i.e. the temperature of the room or environment in which the casting is being performed) as well, as the materials are fluid at room temperatures without need of additional heating. In some circumstances a brief period of heating may be called for to complete the curing process, but this is still at lower temperatures and for less time than that required for traditional epoxy materials.

Figure 1:
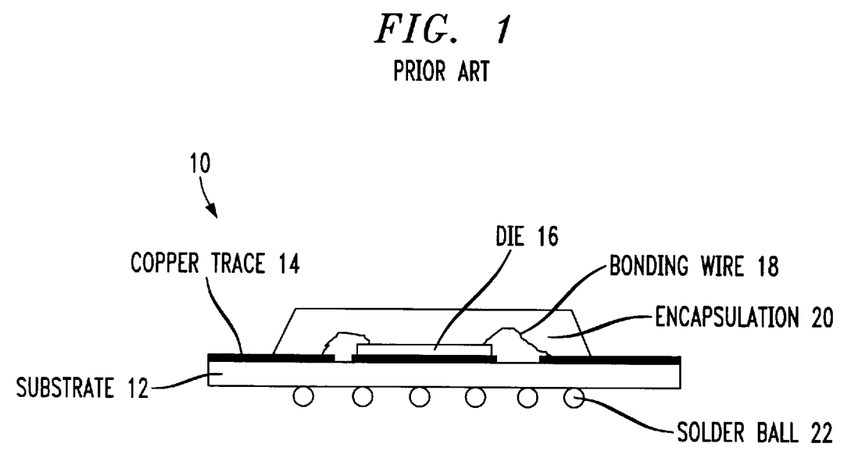
FIG. 1 is a schematic cross-sectional diagram of an "overmolded" semiconductor device.

FIG. 1 illustrates a more conventional semiconductor device package which is formed using an "overmolding" process. Substrate 12 has been combined or etched with a set of traces 14 to provide a base or lead frame for the die. Die 16 is bonded to substrate 12 and in this illustration linked in electrical communication with traces 14 (which will also be referred to more generally as conductive connecting points) by bonding wires 18. With die 16 mechanically and electrically connected to substrate 12 and traces 14, a package is needed to protect those links, the die, and the semiconductor device as a whole. The combined substrate 12 and die 16 are sent into an injection or transfer molding machine, where encapsulation material 20 is applied at high pressure and high temperature within a mold to the die substrate combination forming a package body or device body over the substrate and die. A 2 to 3 minute cycle time for the encapsulation material (typically an epoxy resin) will be required, followed at a later time by a post-cure period (typically 2 to 3 hours) for the epoxy molding compounds used in this type of overmolding process. As may be seen from FIG. 1, the encapsulation material 20 does not fully cover the surface of substrate 12 leaving exposed traces 14.

Figure 2:
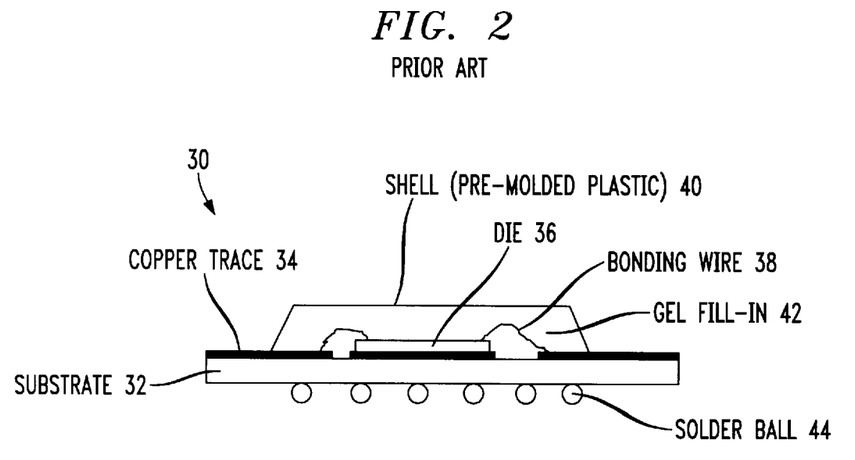
FIG. 2 is a schematic cross-sectional diagram of a "shell & gel" semiconductor device.

FIG. 2 illustrates a semiconductor device package using a "shell and gel" approach. Again a substrate 32 with traces 34 has been mechanically bonded with die 36, with the mechanical bond itself in some circumstances also providing an electrical connection to a conductive connection on the substrate beneath the die). Die 36 has been electrically connected to traces 34 using bonding wires 38. After electrical and mechanical connection of die 36, a premolded plastic shell 40 is attached over die 36 and its bonds on top of substrate 32. Shell 40 also does not extend to the edge of substrate 32 leaving exposed copper traces 34. To complete the protection of the die and its connections a non-conductive gel 42 is injected into shell 40, filling the enclosed area and providing support to die 36 and bonding wires 38. Both FIGS. 1 & 2 involve semiconductor devices using ball grid arrays and hence solder balls 22 and solder balls 44 respectively are attached to the base, or bottom surface of semiconductor devices 10 and 30 respectively. This is typically done after encapsulation is complete.

Figure 3:
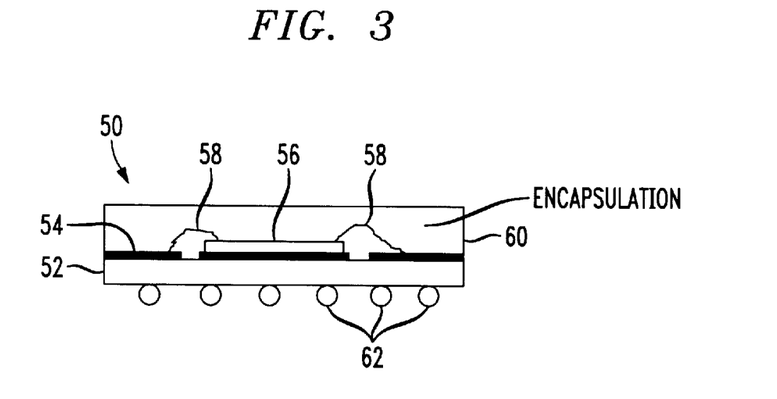
FIG. 3 is a schematic cross-sectional diagram of an overcast wire-bonded semiconductor device.

FIG. 3 illustrates a semiconductor device 50 of the present invention packaged using the overcasting process. Again substrate 52 with traces 54 has been mechanically attached to die 56, with the mechanical bond itself providing an electrical connection to a conductive connection on substrate 52 beneath die 56). Additional electrical connections are formed by bonding wires 58 between die 56 (and specifically conductive connecting points on the die which are not shown) and traces 54. While this example and those that follow focus on the use and connection of a semiconductor die to a substrate in a semiconductor device, the invention is equally applicable to any electrical component connected and enclosed within a device package under the terms of the invention. Encapsulation material 60 has been cast over the complete substrate 52, die 56, and bonding wires 58. It should be noted that the encapsulation material 60 extends to the edge of substrate 52 and does not leave any exposed traces 54. Solder balls 62 have been added after the encapsulation process to form a ball grid array on the base of substrate 52.

Figure 4:
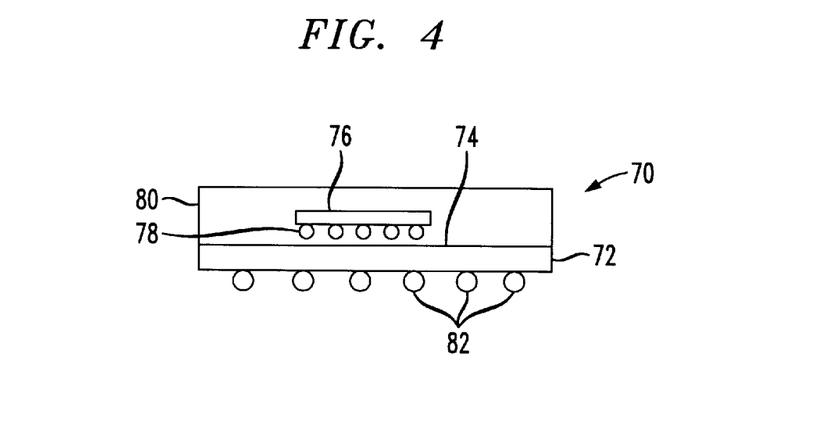
FIG. 4 is a schematic cross-sectional diagram of an overcast flip-chip semiconductor device.

FIG. 4 illustrates a flip-chip semiconductor device produced using the overcasting method. Substrate 72 with interconnect pads 74 (the examples of the present application include both traces and interconnect pads, the invention generally applies to any conductive connecting point which may be used to permit electrical communication) has been mechanically and electrically bonded with die 76 by means of conductive material 78, which may take the form of solder balls or of one of several materials known in the art which are both mechanically adhesive and electrically conductive. Although not shown, solder balls 78 may electrically connect die 76 (which is a flip-chip) while interspersed adhesive material is present between solder balls 78, mechanically connecting die 76 to interconnect pads 74 and substrate 72. Again, the encapsulation material 80 has been cast over the die substrate combination, leaving no exposed conductive connecting points and protecting the semiconductor die. The illustrated embodiment uses a ball grid array, again having the presence of solder balls 82. Alternative embodiments could use other means to connect the semiconductor device to its future destination, such as ball grid arrays, pin grid arrays, land grid arrays, or other methods known in the art.

Figure 5:
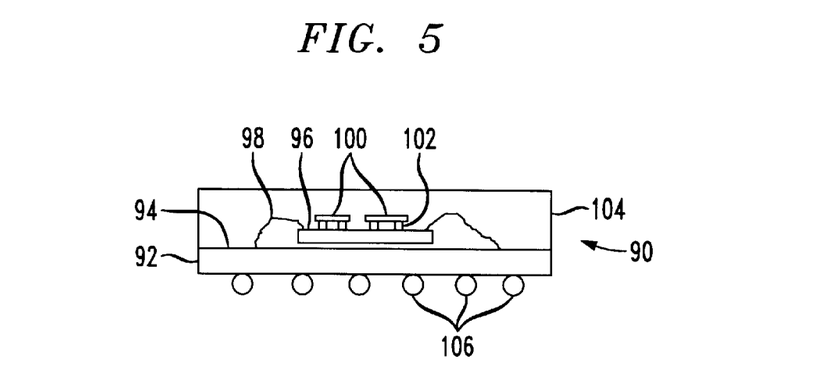
FIG. 5 is a schematic cross-sectional diagram of an overcast multi-chip module semiconductor device.

FIG. 5 illustrates an overcast multi-chip module 90 within the present invention. Substrate 92 and traces 94 are mechanically connected to die 96 and electrically connected by bonding wires 98. Additional component dies 100 (which in the illustrated embodiment are flip-chip dies) are electrically connected to die 96 by means of solder balls 102. The entire module, including the full surface of substrate 92, is covered by encapsulation material 104, again leaving no exposed traces on the upper surface of substrate 92. Again a ball grid array is used, hence the presence of solder balls 106 in the illustrated embodiment.

Figure 6:
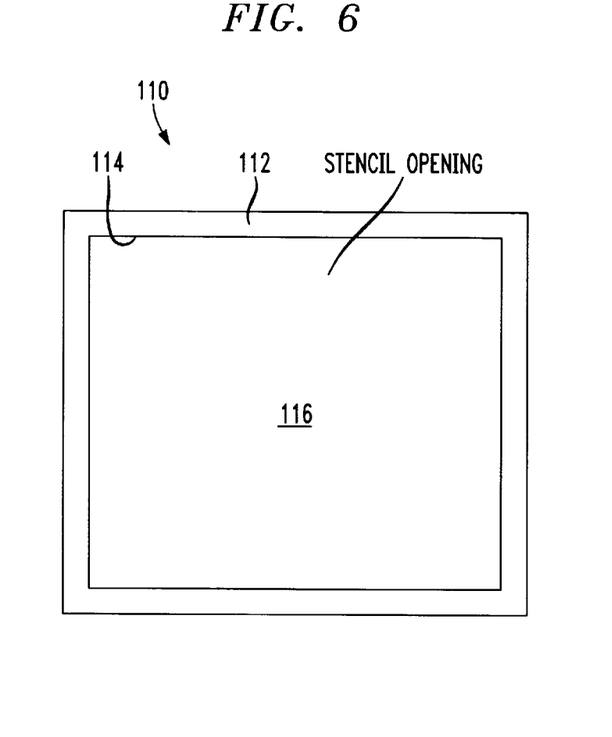
FIG. 6 is a schematic diagram of a stencil for use in overcasting.
Figure 7:
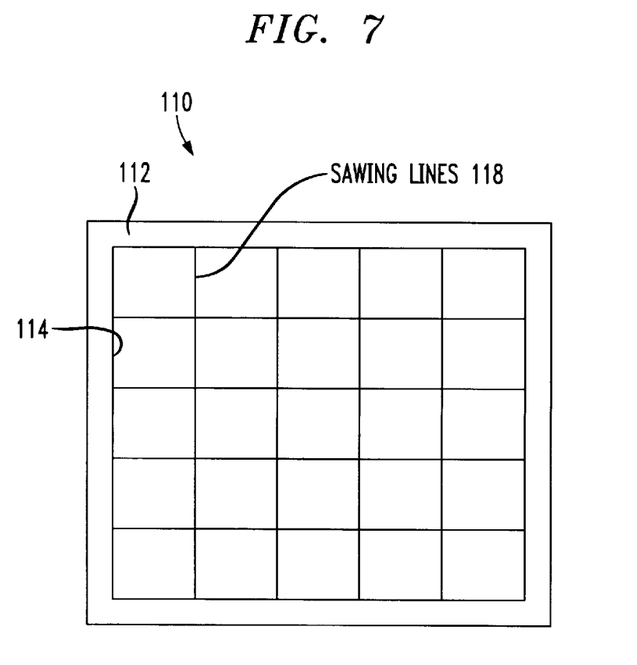
FIG. 7 is a schematic diagram of a stencil and encapsulated substrate illustrating the lines for separating individual devices.

Semiconductor devices whose packages were formed using several alternative methods of overcasting are included in the present invention. FIGS. 6 & 7 show a first method for creating a flat top, overcast package using a stencil. Such a stencil may be manufactured with typical materials for use in combination with a surface mount assembly screen printing process as known in the art. A material like teflon is preferable for use in such a stencil to help with mold release. Alternatively a regular stencil material which has teflon coating on its sidewalls may also be used. Stencil 110 has a single large opening 116. The stencil is positioned over a substrate with a series of discrete areas, each with a die or dies already mechanically and electrically bonded to the substrate and left in an exposed position. The walls 112, specifically the sides 114 of walls 112, work with the substrate to form a cavity into which encapsulation material is poured for casting purposes. The stencil is aligned such that all of said electronic components and all of said conductive connecting points on said top surface of each of the discrete portions of the substrate are within the boundaries defined by the walls of the stencil.

Selection of the encapsulation material provides significant flexibility in the present invention. While conventional epoxy resins and other known encapsulation material could be used with the overcasting method to obtain devices within this invention, additional advantages can be realized if some new long shelf life materials are incorporated, such as the DYMAX 9001 series of urethane-based UV-cured encapsulative materials. These newer materials are not as suitable for conventional molding methods, typically having trouble specifically with the significantly higher pressures and higher temperatures involved with pressure molding. Additionally, the present overcasting method allows the incorporation of ultraviolet ("UV")-cured materials (polyurethane or silicon based), which have very short cycle times on the order of 5 to 10 seconds and no need for extended post cure time such as that used within a traditional epoxy molding compound used in a transfer or injection molding process. UV-cured materials generally have very rapid cure times which are triggered or driven by exposure to critical levels of UV light (where criticality may be defined by length of exposure, radiance of exposure, or a combination of the two). For example, the critical levels for current materials in the DYMAX 9001 series of aerobic urethane encapsulating resins is approximately 200 $mW/cm^2$ @ 365 nm, although lower levels could be used with these materials, such as 100 $mW/cm^2$, resulting primarily in a slightly longer cure time. As these materials continue to develop, the critical levels of exposure needed are often continuing to drop to lower and lower levels. While the critical levels will vary between different UV-cured materials, these levels are recognized by those skilled in the art. Such UV-cured materials are difficult or impossible to use with injection molding as the enclosed mold cavity blocks outside sources of light such as the critical level of UV light needed to initiate curing in a UV-cured material.

One specific example of a UV-cured material which may be used in the present invention is UV/Visible curing aerobic urethane encapsulants, such as the DYMAX 9001 series of resins. Aerobic urethane encapsulants remain stable at room temperature, requiring no freezing or refrigeration. This assures no waiting for the resin to thaw, unlimited pot life in the dispensing equipment, one-year minimum shelf life, and easy, precise dispensing. Tough, flexible aerobic urethane encapsulants act as thermal and mechanical shock absorbers. Their excellent adhesion, resiliency, and flexibility, allows them to resist delamination or cracking upon exposure to sudden and extreme temperature changes. Low stress and high elongation properties minimize the need to closely match thermal expansion coefficients. UV/Visible light curing encapsulants are available in opaque and optically clear formulations. A combination of UV, visible, and infrared curing chemistries cures black encapsulants quickly. The same type of blend of chemistries allows the encapsulants to cure beneath components in areas where UV and visible light cannot reach, such as flip-chip underfill. UV/Visible aerobic encapsulating resins may use a special curing system combining UV and visible light to cure a thick, tough skin over the surface of the encapsulant. Then, infrared heat may be used to cure any portion of the adhesive that was shaded or not directly exposed to the light. Photocuring occurs in seconds. Infrared/heat cure requires a minute or less to complete. Aerobic encapsulants cure best with lamps having less than 15% of their output in the 200–300 nm range. The most effective lamps for these encapsulants have a UV peak output at 365 nm and strong outputs at 405 nm and 436 nm. The encapsulating material of this specific example offers extremely fast processing times, high purity, low modulus, and low glass transition temperature. While this specific example was addressed to illustrate these types of UV-cured materials, one skilled in the art will recognize that other variations of this type of material and other types of UV-cured materials (such as silicone based UV-cured materials) may also be employed under the teachings of the present invention.

In selecting the encapsulation material, a low viscosity or self leveling material may be used so that the material is simply poured into the cavity 116 formed by the stencil and levels itself. Alternatively, a slightly higher viscosity material may be used and may then be squeegeed or "printed" over the top of the cavity in a leveling step during formation to help generate a flat top package.

After the cast material has been cured or cycled, FIG. 7 illustrates the lines 118 along which the various semiconductor device packages may be separated. While this is typically done through a sawing process (sawing through both the new encapsulation material and the substrate below to separate individual semiconductor devices) other methods of separation may be used. For example, in some circumstances perforations or indentations may be applied along lines 118 allowing the various component devices to be broken or snapped off by hand or machine. The sawing or separation efforts may be performed by hand for low number runs. Alternatively, automated systems known in the art may be set up to accomplish such separation. The example shown in FIG. 7 would create 25 individual semiconductor devices after separation.

Figure 8:
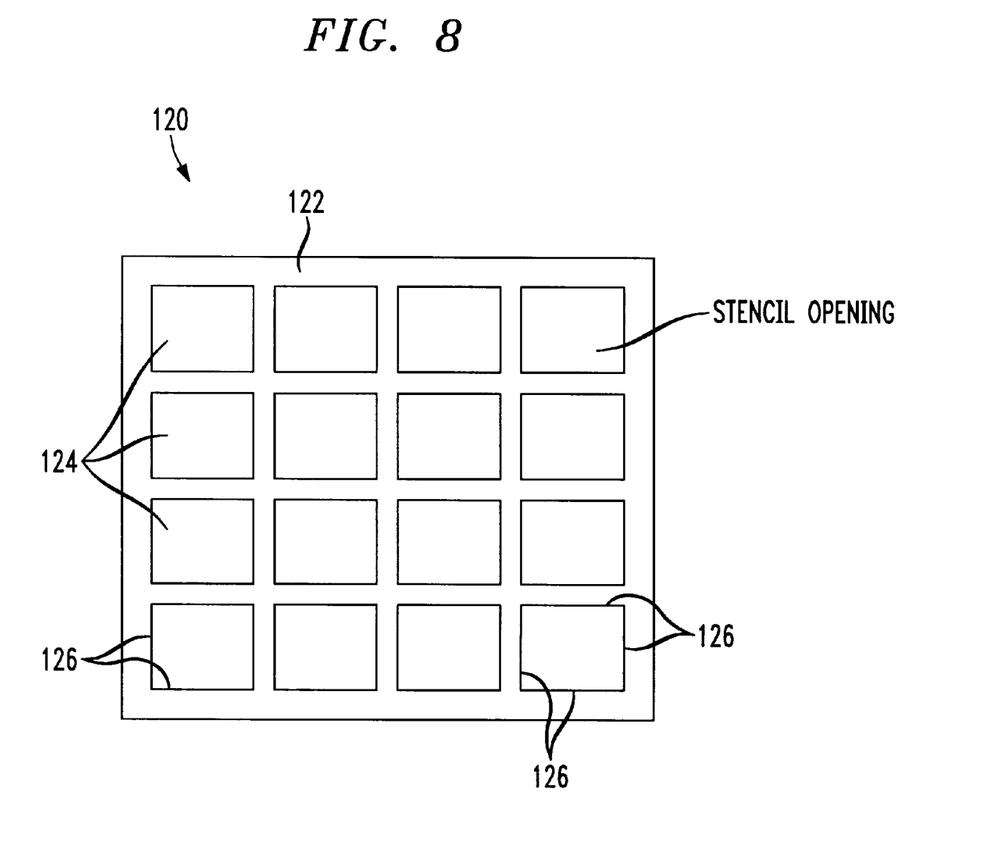
FIG. 8 is a schematic diagram of a stencil providing individual profiles for each semiconductor device to be overcast.

FIG. 8 illustrates another method to create a flat top overcast package by using a stencil 120 with individual openings 124 for each semiconductor device to be packaged. The example illustrated in FIG. 8 would create 16 packages after the substrate was sawed between the individual packages. The inside walls 126 of each opening 124 are preferably tapered to create easier mold release. Tapered walls on the package body are not required for the invention, however. Again the stencil walls 122 may be made from a material like teflon to help with mold release, or the inside walls 126 may be coated with a teflon material while the stencil itself 122 is made from a more standard material known in the art.

For the method shown in FIG. 8, a large substrate with numerous dies or sets of dies, is assembled and then run under stencil 120 with the individual die packages aligned underneath openings 124, forming individual cavities within which the die and conductive connecting points are contained. The encapsulation material is cast through the stencil over the individual die or die assemblies and their attachments to the substrate. Depending upon the encapsulation material chosen, the material may be self-leveling, or a squeegee or printing run may be done as a leveling step, flattening out the top and leveling the material out at the level of the stencil top. As previously noted, in a preferred embodiment, a UV-cured encapsulation material would be used. In the use of a UV-cured encapsulation material, after the leveling, the stencil and substrate combination may be moved under a UV-source, or alternatively a UV-source may be turned on over a stencil with the substrate beneath it and the encapsulation material exposed to the critical level of UV-radiation, initiating its quick curing process. After curing, the substrate and encapsulations would be ejected from the stencil, or alternatively, the stencil removed from the top of the large substrate, leaving a series of encapsulated semiconductor device packages, which are still connected by the base substrate. The substrate could then be sawed or the individual packages otherwise separated from each other in the next step of the process. A final component to be added to the semiconductor device of the present invention could be solder balls if a ball grid array is a desired mode for the device packages.

Figure 9:
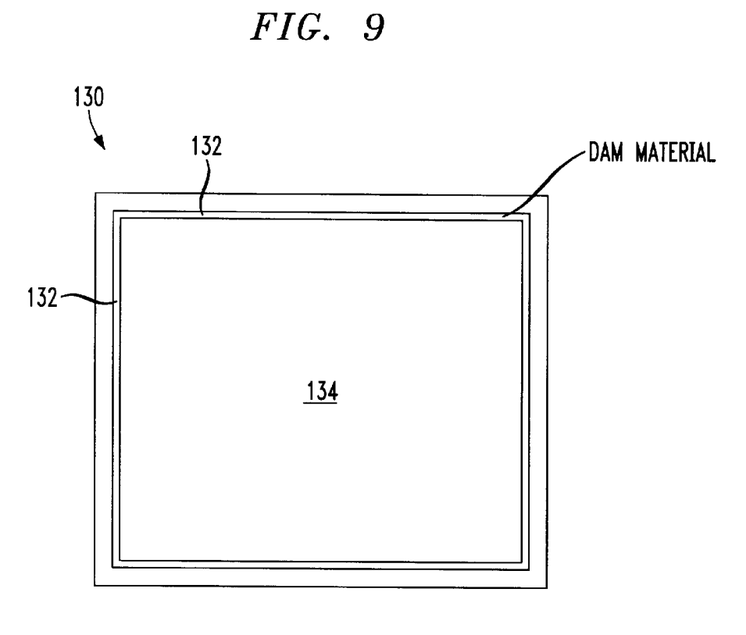
FIG. 9 is a schematic diagram of a dam system for overcasting.
Figure 10:
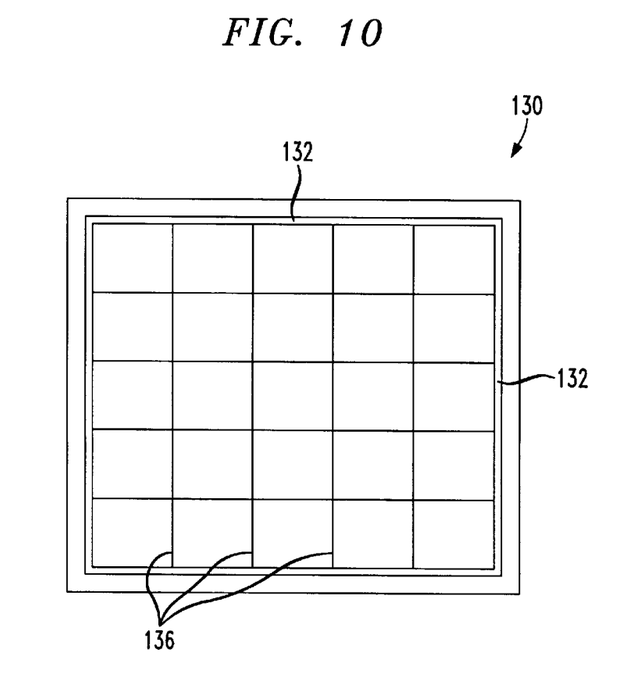
FIG. 10 is a schematic diagram of a dam system and encapsulated substrate illustrating the lines for separating individual devices.

A final alternative method is illustrated in FIGS. 9 & 10 for creating a flat top overcast package. This method uses no stencil. Instead a dam 130 is constructed along the edge of the overall substrate. In this manner, the initial substrate includes a dam 130 and moves through the process without need for a stencil to be put into place or moved. This could speed up the process of assembling and forming the semiconductor device packages, but, however, there would be the added expense of constructing a dam on each of the overall substrates being processed. The dam would include side barrier walls 132 and a large opening 134. After the substrate, which includes the dam 130, has had its individual die attached and connected, the entire substrate would be moved into the overcasting section of the process, where the encapsulation material would be poured into the large opening 134, much as the material was poured into the stencil with the individual large opening as illustrated in FIG. 6. Again, after curing the individual semiconductor device packages would be separated by sawing or other means along lines 136 illustrated in FIG. 10. Device packages produced using this alternative method of the overcasting process would again have flush edges. In final processing of course, the dam would be one of the components sawed off or otherwise separated and discarded from the overall substrate.

Figure 11:
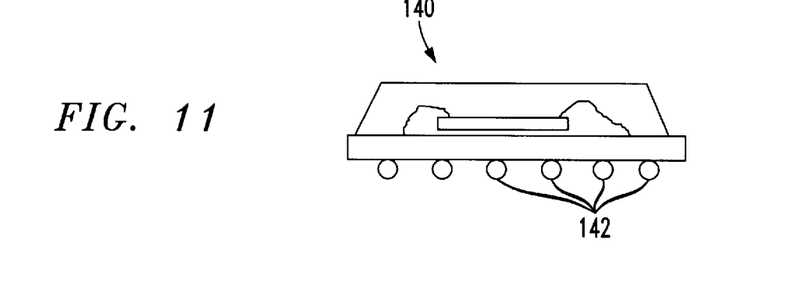
FIG. 11 is a schematic cross-sectional diagram of a tapered overcast semiconductor device using a ball grid array.
Figure 12:
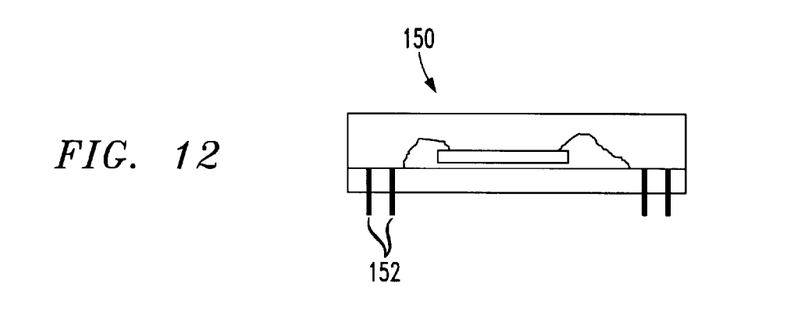
FIG. 12 is a schematic cross-sectional diagram of a flush overcast semiconductor device using I/O pins.

As previously discussed, numerous methods may be used to provide connection between the semiconductor device package formed by the overcasting method and whatever final structure the semiconductor device package is being utilized in. FIG. 11 shows a semiconductor device package 140 which again contains a ball grid array, including solder balls 142. FIG. 12 shows semiconductor device package 150 which utilizes through-hole I/O pins 152.

Figure 13:
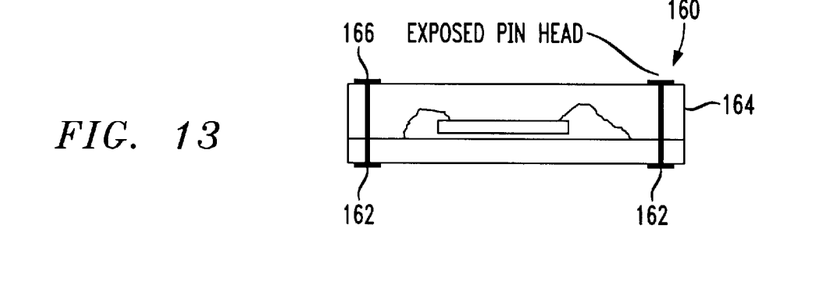
FIG. 13 is a schematic cross-sectional diagram of a flush overcast semiconductor device using I-shaped I/O pins.
Figure 14:
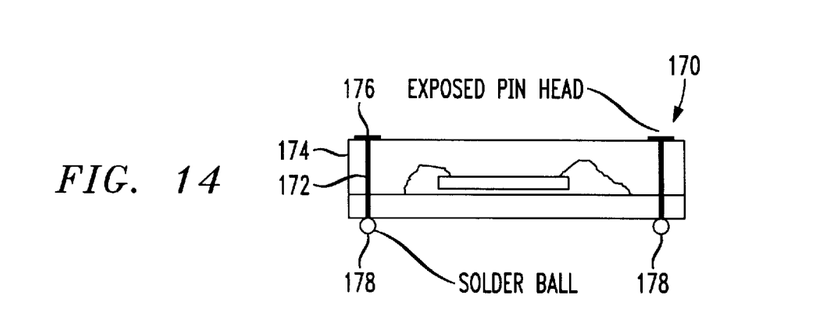
FIG. 14 is a schematic cross-sectional diagram of a flush overcast semiconductor device using T-shaped I/O pins with solder balls.

FIG. 13 shows a semiconductor device 160 which utilizes I-shaped I/O pins 162. These pins provide electrical connections both on the upper surface of a semiconductor device and on the lower surface of the device. To overcast using this type of I/O pin, the pin is put in place prior to the casting process, and care is exercised to see that the encapsulation material 164 does not rise over the top level of the I/O pins 162 and specifically, that the head 166 of I/O pins 162 remains exposed on or above the surface of the cured encapsulation material 164. FIG. 14 illustrates a semiconductor device 170 using T-shaped I/O pins 172. Like device 160 of FIG. 13 the heads 176 of these pins 172 must be kept above the top surface of the encapsulation material 174. Instead of a lower head on I/O pins 172, after encapsulation is complete soldier balls 178 may be added to assist in providing electrical connection in the final use. It should also be noted that the I-shaped I/O pins 162 and the T-shaped I/O pins 172, both of which provide electrical connections on top of and on bottom of the device packages 160 and 170 respectively, would be difficult to impossible to incorporate using the traditional overmolding methods and even more so using a shell and gel approach. The open casting method used to obtain the present invention facilitates the use and packaging of this type of semiconductor device.

Figure 15:
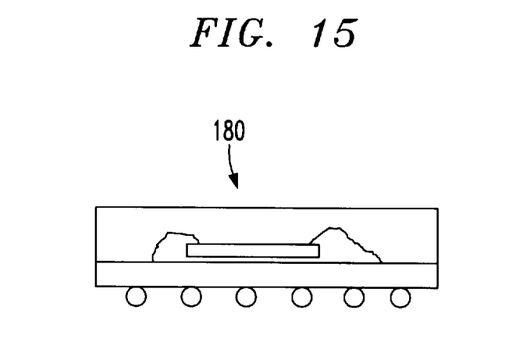
FIG. 15 is a schematic cross-sectional diagram of a flush overcast semiconductor device using a ball grid array.
Figure 16:
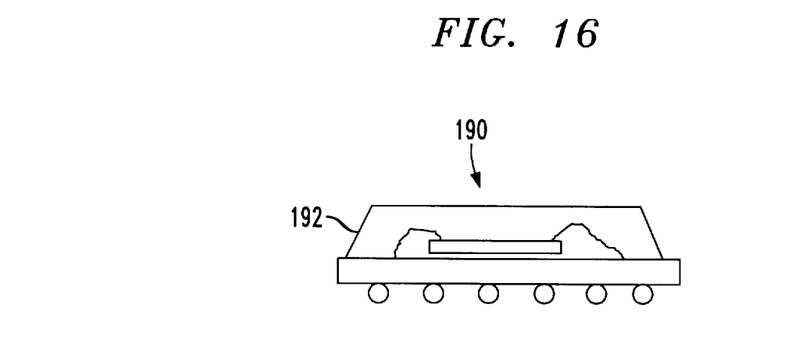
FIG. 16 is a schematic cross-sectional diagram of a tapered overcast semiconductor device using a ball grid array.
Figure 17:
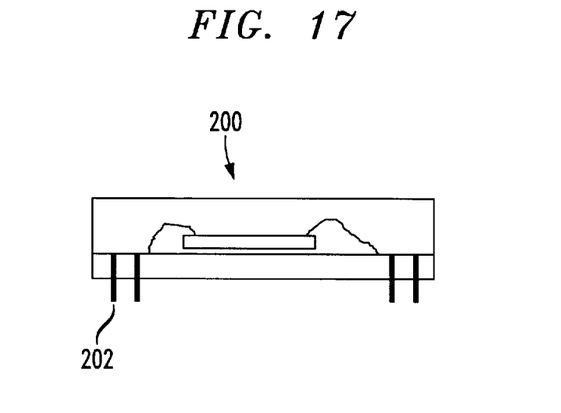
FIG. 17 is a schematic cross-sectional diagram of a flush overcast semiconductor device using through-hole I/O pins.
Figure 18:
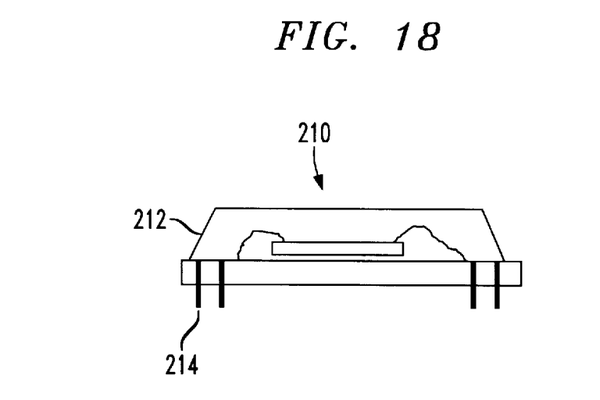
FIG. 18 is a schematic cross-sectional diagram of a tapered overcast semiconductor device using through-hole I/O pins.
Figure 19:
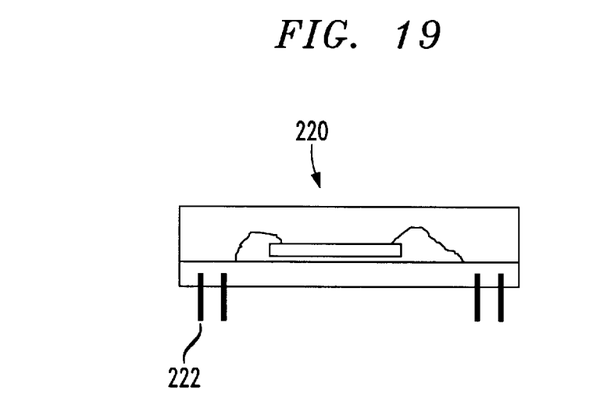
FIG. 19 is a schematic cross-sectional diagram of a flush overcast semiconductor device using half-way I/O pins.
Figure 20:
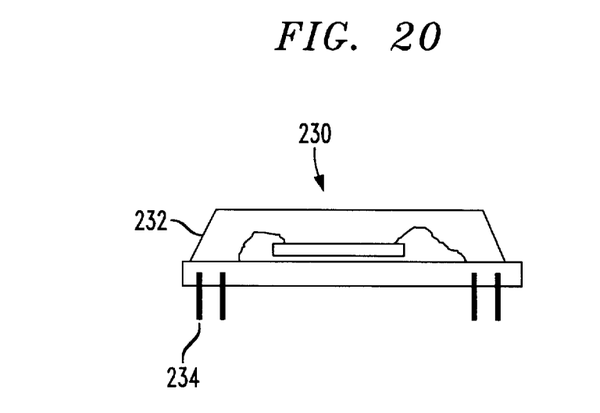
FIG. 20 is a schematic cross-sectional diagram of a tapered overcast semiconductor device using half-way I/O pins.

FIGS. 15–20 show various packaging possibilities based on the alternative methods of overcasting shown by FIG. 6, FIG. 8, and FIG. 9. The large opening stencil of FIG. 6 and the dam of FIG. 9 will both provide flush, straight encapsulations as illustrated in FIGS. 15, 17 and 19. While the individual openings of FIG. 8 could be set up to provide such encapsulation profiles, preferably individual openings would be used to provide tapered sides 192, 212, and 232 on packages 190, 210, and 230 respectively. As previously stated, the use of tapered sides simplifies the ejection of the semiconductor device packages and the full substrate from the stencil. While FIGS. 15 & 16 illustrate standard ball grid array packages, and FIGS. 17 & 18 illustrate the use of through-hole I/O pins (or through-hole pins), FIGS. 19 & 20 show half-way I/O pins (or half-way pins) 222 and 234 respectively. Conductive pins plugged half-way through are commercially available and known to those skilled in the art. The configurations of FIGS. 17 & 18 and of FIGS. 19 & 20 use through-hole installation. The addition of the conductive pins by such through-hole installation, and of the solder balls for the ball grid arrays, typically and preferably is accomplished after the forming of the encapsulation. However, the pins 202 and 214 may be installed in the process prior to encapsulation in order to block the respective holes and help discourage or prevent the movement of encapsulation material through such holes.

The overcasting process discussed may also be used in combination with vias which provide electrical connections from the top surface of the substrate to the bottom surface of the substrate through open holes. Overcasting may even be preferable in combination with such vias because of the low pressure on the encapsulation material during the casting or molding process. In this manner, particularly with selection of a relatively viscous encapsulation material and with smaller vias, surface tension may prevent the material from pushing through the vias during the formation process. In a more standard injection molding or transfer molding process, the vias must be covered to prevent the encapsulation material from flowing through and escaping out the bottom of the substrate or alternatively clogging or plugging the vias. Alternatively, in an injection or transfer molding process, vias may not be directly underneath the area which has been overmolded. In the overcasting process which forms the semiconductor device of the present invention, materials may be used to prevent flow through of encapsulation material during the process, but, particularly for smaller runs or trials, this added expense may not be necessary as the reduced pressures may not overcome the surface tension which would generally discourage flow of the encapsulation material through these holes.

Greater flexibility in what substrates are used may also be obtained through the overcasting process producing the semiconductor device of the present invention. Because of the lower pressures (and temperatures) substrates which have difficulty surviving high pressure molding and are hence unacceptable for overmolding processes may be used with much more success in the overcasting process.

The semiconductor devices of the present invention are produced without requiring the use of runners, removing one of the major sources of wasted material as may exist in an overmolding process. This wastage, particularly with more expensive, more sophisticated encapsulation materials may create a significant cost. The overcasting process will tend to have a shorter cycle time (particularly using a UV-cured material) such as a 5 to 10 second cycle time compared to a 2 or 3 minute cycle time for epoxy transfer molding or injection molding. With proper selection of materials no post cure would be required, compared to a 2 to 3 hour post cure using the epoxy molding compounds in the injection or transfer molding process currently used. Finally, the ability to use newer, longer shelf life materials which are not or may not be appropriate for injection overmolding means no special storage of those materials would be required. This again reduces expense both through special storage and through materials which may be wasted if special storage is not adequate to the task or if the materials are removed and not used in sufficient time.

The overcast packages are able to be created using this method with no or minimal equipment investment. There is no need to design and construct an expensive mold, saving not only money but time, as much as 6 to 8 weeks of lead time.

The overcasting process producing the semiconductor devices of the present invention is especially suited for low volume productions and even more so for experimental productions where various small runs are being made in succession for testing purposes. The runs may be made more quickly due to the lack of need to build a new mold for each run and the expense of each of the new molds is also saved. Added flexibility is also present in the ability to change the size of packages being created with great rapidity. With both of the large opening methods disclosed the size of the packages may be changed simply by changing the size of the substrate without needing to modify any of the equipment for the process itself. The only other change will be in the separation stage where different cuts or size of cuts will be used, but in this manner a larger semiconductor device package can be changed on the fly without need to modify or change the encapsulation section of the process at all. At the same time, excellent low profiles may be obtained and device packages similar to those resulting from overmolding may be obtained if the standard epoxy encapsulation material of overmolding is used in the overcasting process. In this manner, the resulting device packages from overcasting may be considered to effectively simulate for testing purposes what final packages from a more traditional molding process would be like.

Finally, overcasting as just discussed is compatible with either surface mount or through-hole packages and provides the ability to use some of the newer encapsulation materials, (such as those providing a longer shelf life or such as UV-cured materials) which are either not appropriate, not as effective, or not capable of being used at all with the traditional methods.

Having described specific embodiments of the present invention, it will be understood that modifications thereof may be suggested to those skilled in the art, and it is intended to cover all such modifications as fall within the scope of the appended claims.

What is claimed:

1. A semiconductor device comprising:
    a substrate having a top surface and a bottom surface, said top surface having at least two conductive connecting points in electrical communication with at least two conductive connecting points on said bottom surface;
    a semiconductor die mechanically connected to said top surface of said substrate and electrically connected to said conductive connecting points on said top surface of said substrate;
    a package body formed by casting an electrically insulative encapsulating material at approximately ambient pressure over said electronic component and over all of said conductive connecting points on said top surface of said substrate; and
    said encapsulating material comprising an ultraviolet cured aerobic urethane material cured by exposure to a combination of ultraviolet and visible light.

2. The semiconductor device of claim 1, wherein said encapsulating material was cured by direct exposure to a critical level of ultraviolet light after formation of said package body.

3. The semiconductor device of claim 1, wherein at least one of said conductive connections on said top surface of said substrate is electrically connected to at least one of said conductive connections on said bottom surface of said substrate by a via.

4. The semiconductor device of claim 1, wherein a plurality of said conductive connecting points on said top surface of said substrate comprise interconnect pads;

wherein a plurality of said conductive connecting points on said semiconductor die comprise interconnect pads; and, wherein said semiconductor die comprises a flip-chip where said interconnect pads on said semiconductor die are electrically connected to said interconnect pads on said top surface of said substrate by a conductive material bonding said interconnect pads of said flip-chip to said corresponding interconnect pads on said top surface of said substrate.

5. The semiconductor device of claim 1, wherein a plurality of said conductive connecting points on said bottom surface of said substrate comprise a ball grid array.

6. The semiconductor device of claim 1, wherein a plurality of said conductive connecting points on said bottom surface of said substrate comprise conductive through-hole pins.

7. The semiconductor device of claim 1, wherein a plurality of said conductive connecting points on said bottom surface of said substrate comprise conductive half-way pins.

8. A semiconductor device comprising:

a substrate having a top surface and a bottom surface, said top surface having at least two conductive connecting points in electrical communication with at least two conductive connecting points on said bottom surface;

a semiconductor die mechanically connected to said top surface of said substrate and electrically connected to said conductive connecting points on said top surface of said substrate;

a package body formed by casting an electrically insulative encapsulating material at approximately ambient temperature over said electronic component and over all of said conductive connecting points on said top surface of said substrate; and said encapsulating material comprising an ultraviolet cured aerobic urethane material cured by exposure to a combination of ultraviolet and visible light.

9. The semiconductor device of claim 8, wherein said encapsulating material was cured by direct exposure to a critical level of ultraviolet light after formation of said package body.

10. The semiconductor device of claim 8, wherein at least one of said conductive connections on said top surface of said substrate is electrically connected to at least one of said conductive connections on said bottom surface of said substrate by a via.

11. The semiconductor device of claim 8, wherein a plurality of said conductive connecting points on said top surface of said substrate comprise interconnect pads;

wherein a plurality of said conductive connecting points on said semiconductor die comprise interconnect pads; and, wherein said semiconductor die comprises a flip-chip where said interconnect pads on said semiconductor die are electrically connected to said interconnect pads on said top surface of said substrate by a conductive material bonding said interconnect pads of said flip-chip to said corresponding interconnect pads on said top surface of said substrate.

12. The semiconductor device of claim 8, wherein a plurality of said conductive connecting points on said bottom surface of said substrate comprise a ball grid array.

13. The semiconductor device of claim 8, wherein a plurality of said conductive connecting points on said bottom surface of said substrate comprise conductive through-hole pins.

14. The semiconductor device of claim 8, wherein a plurality of said conductive connecting points on said bottom surface of said substrate comprise conductive half-way pins.

15. A semiconductor device comprising:

a substrate having a top surface and a bottom surface, said top surface having at least two conductive connecting points in electrical communication with at least two conductive connecting points on said bottom surface;

a semiconductor die mechanically connected to said top surface of said substrate and electrically connected to said conductive connecting points on said top surface of said substrate;

a package body formed by casting an electrically insulative encapsulating material, while directly exposing said encapsulating material to radiation from the surrounding environment, over said electronic component and over all of said conductive connecting points on said top surface of said substrate; and said encapsulating material comprising an ultraviolet cured aerobic urethane material cured by exposure to a combination of ultraviolet and visible light.

16. The semiconductor device of claim 15, wherein said encapsulating material was cured by direct exposure to a critical level of ultraviolet light during the formation of said package body.

17. The semiconductor device of claim 15, wherein said encapsulating material was cured by direct exposure to a critical level of ultraviolet light at the conclusion of formation of said package body.

18. The semiconductor device of claim 15, wherein said encapsulating material was cured by direct exposure to a critical level of ultraviolet light after formation of said package body.

19. The semiconductor device of claim 15, wherein a plurality of said conductive connecting points on said top surface of said substrate comprise interconnect pads;

wherein a plurality of said conductive connecting points on said semiconductor die comprise interconnect pads; and, wherein said semiconductor die comprises a flip-chip where said interconnect pads on said semiconductor die are electrically connected to said interconnect pads on said top surface of said substrate by a conductive material bonding said interconnect pads of said flip-chip to said corresponding interconnect pads on said top surface of said substrate.

20. The semiconductor device of claim 15, wherein a plurality of said conductive connecting points on said bottom surface of said substrate comprise a ball grid array.

21. The semiconductor device of claim 15, wherein a plurality of said conductive connecting points on said bottom surface of said substrate comprise conductive through-hole pins.

22. The semiconductor device of claim 15, wherein a plurality of said conductive connecting points on said bottom surface of said substrate comprise conductive half-way pins.

* * * * *